US010979052B2

(12) United States Patent
Dash et al.

(10) Patent No.: US 10,979,052 B2
(45) Date of Patent: Apr. 13, 2021

(54) LEVEL SHIFTER CIRCUIT GENERATING BIPOLAR CLOCK SIGNALS

(71) Applicant: TEXAS INSTRUMENTS INCORPORATED, Dallas, TX (US)

(72) Inventors: Biraja Prasad Dash, Tucson, AZ (US); Ravinthiran Balasingam, Tucson, AZ (US); Dimitar Trifonov, Vail, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/774,018

(22) Filed: Jan. 28, 2020

(65) Prior Publication Data

US 2020/0162075 A1    May 21, 2020

Related U.S. Application Data

(60) Division of application No. 16/402,262, filed on May 3, 2019, now Pat. No. 10,587,267, which is a continuation of application No. 16/101,699, filed on Aug. 13, 2018, now Pat. No. 10,326,451.

(60) Provisional application No. 62/589,133, filed on Nov. 21, 2017.

(51) Int. Cl.
*H03K 19/0175*    (2006.01)
*H03K 19/0185*    (2006.01)
*H03K 3/356*    (2006.01)

(52) U.S. Cl.
CPC . *H03K 19/01855* (2013.01); *H03K 3/356104* (2013.01); *H03K 19/018564* (2013.01); *H03K 3/356043* (2013.01)

(58) Field of Classification Search
CPC ....... H03K 19/01855; H03K 3/356104; H03K 19/018564; H03K 3/356043
See application file for complete search history.

(56) References Cited

U.S. PATENT DOCUMENTS

| 5,469,110 | A | 11/1995 | Liao |
| 7,602,233 | B2 | 10/2009 | Pietri et al. |
| 7,969,235 | B2 | 6/2011 | Pan |
| 8,005,959 | B2 * | 8/2011 | Bernardi ............... G06F 21/575 |
| | | | 709/213 |
| 8,665,255 | B2 | 3/2014 | Tsujino et al. |
| 9,553,585 | B1 | 1/2017 | Song |
| 2009/0051413 | A1 | 2/2009 | Chu et al. |
| 2012/0268182 | A1 * | 10/2012 | Lee .................. H03K 3/356121 |
| | | | 327/199 |

* cited by examiner

*Primary Examiner* — Dinh T Le
(74) *Attorney, Agent, or Firm* — John R. Pessetto; Charles A. Brill; Frank D. Cimino

(57) ABSTRACT

In some examples, a level shifter circuit comprises: a first transistor pair cascoded at a first input node; a second transistor pair cascoded at a second input node, wherein the first and transistor pairs couple at a first node, a second node, a third node, and a fourth node; a third transistor pair coupled to the first transistor pair at the first and the third nodes, wherein the third transistor pair is configured to generate a first bipolar clock signal; a fourth transistor pair coupled to the second transistor pair at the second and the fourth nodes, wherein the fourth transistor pair is configured to generate a second bipolar clock signal; and a clock generation circuit coupled to the first node, the second node, the third node, and the fourth node.

5 Claims, 4 Drawing Sheets

LEVEL SHIFTER CIRCUIT GENERATING BIPOLAR CLOCK SIGNALS

CROSS-REFERENCE TO RELATED APPLICATIONS

This divisional application claims priority to U.S. patent application Ser. No. 16/402,262, filed May 3, 2019, which application claims priority to U.S. patent application Ser. No. 16/101,699, filed Aug. 13, 2018 (now U.S. Pat. No. 10,326,451), which claims the benefit of and priority to U.S. Provisional Application No. 62/589,133, filed Nov. 21, 2017, all of which are hereby incorporated herein by reference in their entirety.

BACKGROUND

A level shifter circuit transforms an input signal from one voltage level to another. This transformation allows two circuits, which are operating at different voltage levels, to be compatible with each other. For example, a level shifter is needed between a low-power application processor operating at 1.8V and an analog circuitry operating at 3.3 or 5V in order for the combined system to perform reliably.

SUMMARY

In accordance with at least one example of the disclosure, a level shifter circuit configured to generate a first bipolar clock signal and a second bipolar clock signal, the level shifter circuit comprises a first transistor pair cascoded at a first input node; a second transistor pair cascoded at a second input node, wherein the first and transistor pairs couple at a first node, a second node, a third node, and a fourth node. The level shifter circuit further comprises a third transistor pair coupled to the first transistor pair at the first and the third nodes, wherein the third transistor pair is configured to generate the first bipolar clock signal; a fourth transistor pair coupled to the second transistor pair at the second and the fourth nodes, wherein the fourth transistor pair is configured to generate the second bipolar clock signal; and a clock generation circuit coupled to the first node, the second node, the third node, and the fourth node, wherein the clock generation circuit is configured to generate a first clock at the first node, a second clock at the second node, a third clock at the third node, and a fourth clock at the fourth node.

In accordance with at least an example of the disclosure, a system, comprises a first metal-oxide-semiconductor field-effect-transistor (MOSFET) having a first source terminal, a first drain terminal, and a first gate terminal; a second MOSFET having a second source terminal, a second drain terminal, and a second gate terminal, wherein the first source terminal couples to the second source terminal at a first input node; a third MOSFET having a third source terminal, a third drain terminal, and a third gate terminal; a fourth MOSFET having a fourth source terminal, a fourth drain terminal, and a fourth gate terminal, wherein the third source terminal couples to the fourth source terminal at a second input node. The system further comprises a first transistor circuit coupled to the first drain terminal, the second drain terminal, and the first input node; and a second transistor circuit coupled to the third drain terminal, the fourth drain terminal, and the second input node, wherein the first drain terminal couples to the third gate terminal at a first node, the third drain terminal couples to the first gate terminal at a second node, the second drain terminal couples to the fourth gate terminal at a third node, and the fourth drain terminal couples to the second gate terminal at a fourth node, wherein the first node couples to a first capacitor that is configured to receive a first clock signal, the second node couples to a second capacitor that is configured to receive a second clock signal, the third node couples to a third capacitor that is configured to receive a third clock signal, the fourth node couples to a fourth capacitor that is configured to receive a fourth clock signal, wherein the first, second, third, and fourth clocks oscillate between a first voltage level and a second voltage level.

In accordance with at least one example of the disclosure, a system, comprising an oscillator configured to generate a first clock signal; and a level shifter circuit coupled to the oscillator and comprising multiple transistors, and having a first input terminal, a second input terminal, a first output terminal, and a second output terminal, the first input terminal is configured to receive a first input signal, and the second input terminal is configured to receive a second input signal, wherein the level shifter is configured to generate a second clock signal and a third clock signal that oscillate around the first input signal and the second input signal, respectively.

BRIEF DESCRIPTION OF THE DRAWINGS

For a detailed description of various examples, reference will now be made to the accompanying drawings in which.

DETAILED DESCRIPTION

Figure 1A:
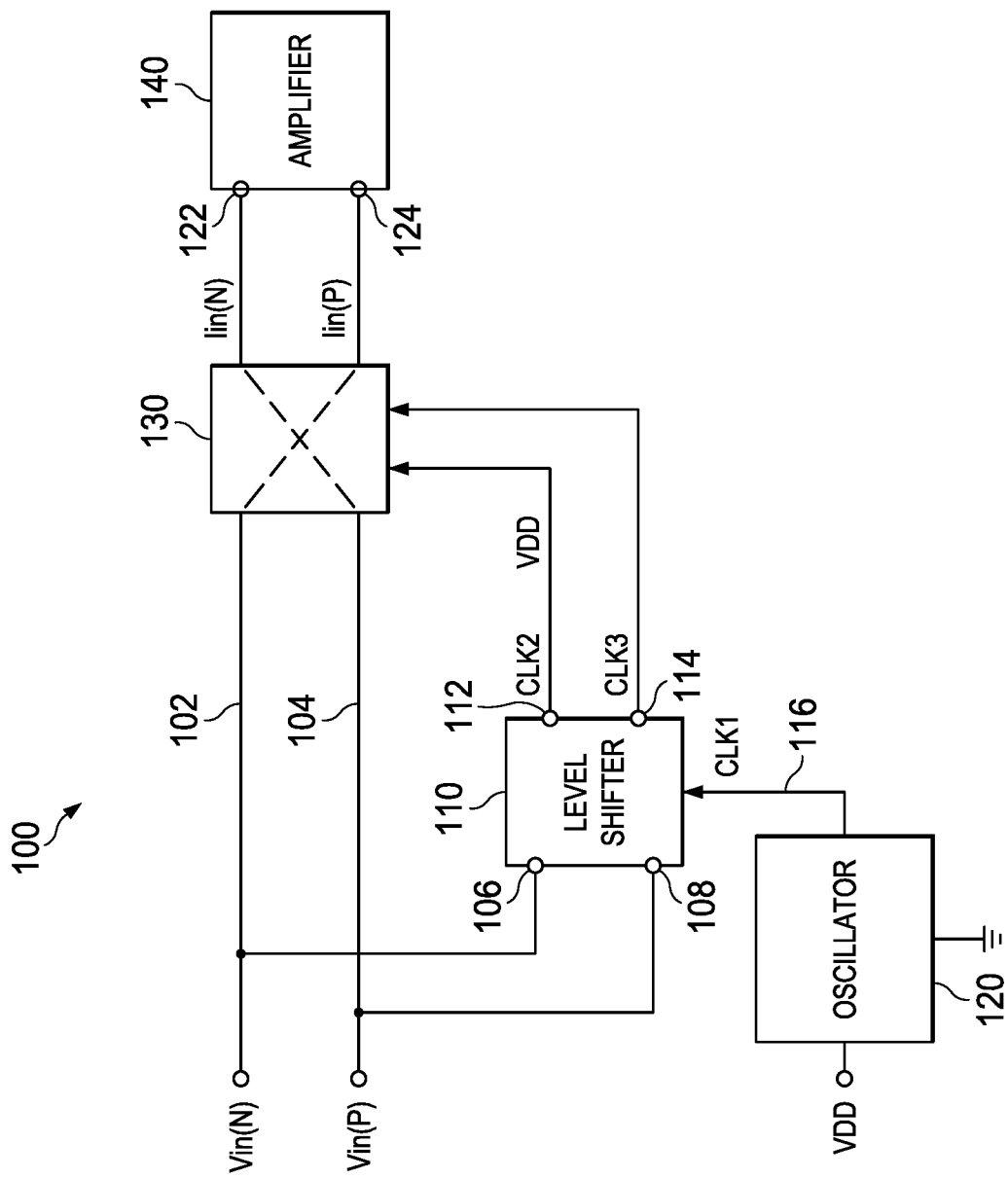
FIG. 1(a) is an illustrative schematic diagram of a portion of a chopper amplifier circuit, in accordance with various examples.

As noted above, a level shifter circuit can be employed in an application that includes multiple circuits operating at different voltage levels. One such application includes a chopper amplifier circuit. A chopper amplifier circuit receives an input signal and produces an amplified version of the received input signal. A chopper amplifier circuit is different from a typical amplifier circuit in that the chopper amplifier circuit includes one or more chopper circuits that are configured to remove offset and other errors associated with the typical amplifier. A chopper amplifier circuit, in some cases, includes an input chopper circuit that converts the input signal (e.g., a signal that is substantially constant like a direct current (DC) signal) to a alternating output signal (e.g., alternating current (AC) signal or an alternating DC signal) by switching the polarity of the input signal with a fixed frequency. This alternating output signal is then amplified by an amplifier. In some cases, the chopper amplifier circuit also includes an output chopper circuit that couples to the outputs of the amplifier, and converts the amplified alternating output signal to an amplified DC signal, which, in other words, is an amplified version of the input signal. Using a chopper circuit, or, in other words, converting a fixed DC signal to a alternating DC (or AC) signal before amplification is beneficial because the non-idealities (e.g., offset, noise) introduced by the amplifier to the alternating DC signal are easier to compensate relative to the non-idealities introduced by the amplifier to a fixed DC signal.

In some cases, a chopper circuit includes two pairs of transistors (e.g., metal-oxide-semiconductor-field-effect-transistors (MOSFET)) that are alternatively turned-on/turned-off using a clock signal. Stated another way, the clock signal provides a gate signal to each of the transistors and controls the turn-on/turn-off instances of the transistors. This alternating turning-on/off of the transistors facilitates converting an input DC signal to alternating DC signal.

In some cases, to effectively turn-on/off the transistors, the voltage levels of the clock signal need to be level shifted to match the voltage level of the input DC signal. For example, assume that a chopper circuit employs one or more n-doped MOSFETs (nMOS), and the input DC signal is received by their source terminals. In order for the nMOS to effectively (e.g., nMOS in the active region) turn-on, the gate signal needs to be higher than the sum of the source voltage (e.g., input voltage) and a threshold voltage of nMOS. On the other hand, in order for the nMOS to effectively turn-off, the gate signal needs to be below the input DC signal plus the threshold voltage of nMOS, as described further below. Therefore, in cases where the clock signal and the input signal received by the chopper circuit operate at different voltage levels, the clock signal needs to be level shifted. As an example, assume that the clock signal oscillates between 0 and 1.7V and the input signal is a 40V DC supply. In such a scenario, the clock signal needs to be level shifted to be higher (in the case of n-doped MOSFET) or lower (in the case of a p-doped MOSFET) than the input signal voltage by threshold voltage in order to effectively turn-on the transistors. Whereas, to turn-off these transistors, clock signal needs to be below/above the input voltage plus the threshold voltage for nMOS/pMOS, respectively. In some cases, it is a common practice to bring the gate voltage equal to source voltage to turn off the nMOS/pMOS switches.

As noted above, the transistors in the chopper circuit are alternately turned on and off, such that, when the first pair of transistors is turned on, the second pair is turned off, and vice-versa. In such a case, a finite voltage differential (e.g., the voltage between the input voltages, which is typically on the order of hundreds of mV) exists across the pair of transistors that are turned off ("off-transistors"). In some cases, the turn-off signal provided by the level shifted clock signal does not properly turn-off the off-transistors. For example, assume that an nMOS transistor is about to be turned off. The gate signal, in such a scenario, needs to be below the source voltage (e.g., input voltage) plus the threshold voltage and, as noted above, it is a common practice to bring the gate voltage equal to source voltage to turn off the nMOS transistor. However, due to non-idealities of the nMOS transistor (e.g., due to parasitic body diodes), the nMOS does not turn-off when gate voltage is brought equal to source voltage (e.g., below the source voltage plus the threshold voltage). Therefore, to effectively turn-off the nMOS, gate voltage of the nMOS needs to be taken below the source voltage by an additional voltage. Stated another way, in a case where the turn-off signal is not low enough to adequately turn-off the off-transistors, the voltage differential across off transistors which could be hundred millivolts produces significant leakage, which, in some cases, distorts the input signal. This leakage exacerbates in high-temperature conditions. Since the turning on and turning off of these pairs of transistors is controlled by the level shifted clock signal mentioned above, a level shifter that can transform the clock signal to a level that can suitably turn on & off the transistors is needed.

Currently used techniques employ level shifted clock signals that swing in one polarity relative to the input signal. For example, in case of an nMOS transistor, the level shifted clock which drives the gate swings unipolarly in the positive polarity (relative to a positive input signal at source) above threshold voltage to turn-on the nMOS and swings only down to input source voltage (relative to the positive input signal) to turn-off the nMOS. However, a level shifted clock that swings below nNOMS source voltage in a bipolar polarity relative to the input signal is desired.

Accordingly, this disclosure describes various examples of a level shifter configured to generate bipolar clock signals to control (e.g., effectively turn-on/turn-off) transistors in an input chopper circuit. The level shifter described in this disclosure relates to a chopper amplifier. However, the examples of the level shifter described herein are not limited to chopper amplifiers, and can be employed in other applications that require level shifting a clock signal from one voltage level to another. Some of the other applications include: auto zero amplifiers and switching regulators.

FIG. 1(a) is an illustrative schematic diagram 100 depicting a portion of a chopper amplifier circuit that includes a level shifter circuit (or level shifter) 110, an oscillator 120, a chopper circuit 130, and an amplifier 140. The chopper circuit 130 acts as the above-referenced input chopper circuit, and couples to the input terminals 122, 124 of the amplifier 140. The chopper circuit 130 is configured to receive input signals Vin(N) (or VinN), Vin(P) (or VinP) via the wires 102, 104. The input signals Vin(N), Vin(P) are the negative and positive terminals, respectively, of a DC voltage source (not expressly depicted in FIG. 1(a)) coupled to the wires 102, 104. The chopper circuit 130, as described above, transforms the input signals Vin(N), Vin(P) to alternating output signals Iin(N) and Iin(P), which are then amplified by the amplifier 140. In some examples, another chopper circuit (not expressly shown in FIG. 1(a)) is coupled to the outputs of the amplifier 140, and converts the amplified alternating output signals (not expressly depicted in FIG. 1(a)) to a DC signal, which is an amplified version of the input signals Vin(N), Vin(P). In some examples, the chopper circuit 130 includes four pairs of switches (not expressly shown), where each pair includes one nMOS transistor and a pMOS transistor. In other examples, the chopper circuit 130 includes other suitable arrangement of transistors that perform the chopper function.

In some examples, the level shifter 110 has input terminals 106, 108 that couple to the wires 102, 104, respectively. The input terminals 106, 108 are configured to receive the input signals Vin(N), Vin(P), respectively. The level shifter 110 has output terminals 112, 114 that couple to the chopper circuit 130. The level shifter 110 also couples to the oscillator 120 via a wire 116. The oscillator 120, in some examples, powered from a voltage VDD (e.g., 5V) from a voltage source (not expressly shown) relative to a ground source terminal, and is configured to generate a clock signal CLK1, which is provided to the level shifter 110 via the wire 116. The oscillator 120 also couples to the ground source terminal, as shown. In some examples, the level shifter 110 includes multiple transistors (not expressly shown in FIG. 1). As further described below with respect to FIG. 2, each of these multiple transistors is configured to turn-on and turn-off based on the clock signal CLK 1, and the input signals Vin(N), Vin(P). As further described below in FIGS. 2(a)-2(b), this turning on and off of the multiple transistors facilitates generating the clock signals CLK2, CLK3 that are level shifted relative to the clock signal CLK1. In some examples and as further depicted in FIG. 1(b), the clock signals CLK2 and CLK3 "oscillate around" the input signal Vin(N) and the input signal Vin(P), respectively. By "oscillate around," it is meant that, for example, CLK2 is a pulse train that periodically rises above and falls below the input signal Vin(N), and that CLK3 is a pulse train that periodically rises above and falls below the input signal Vin(P) by VDD. This oscillation by VDD above and below Vin(N) & Vin(P), or in other words, "around" input signals is described in greater detail below. It is synonymously referred to herein as "bipolar oscillation."

The description above discloses the level shifter 110 generating two clock signals, CLK2 and CLK3. However, the number of clock signals generated by the level shifter 110 is not limited to two. In other examples, the number of clock signals generated by the level shifter 110 is more than two.

Figure 1B:
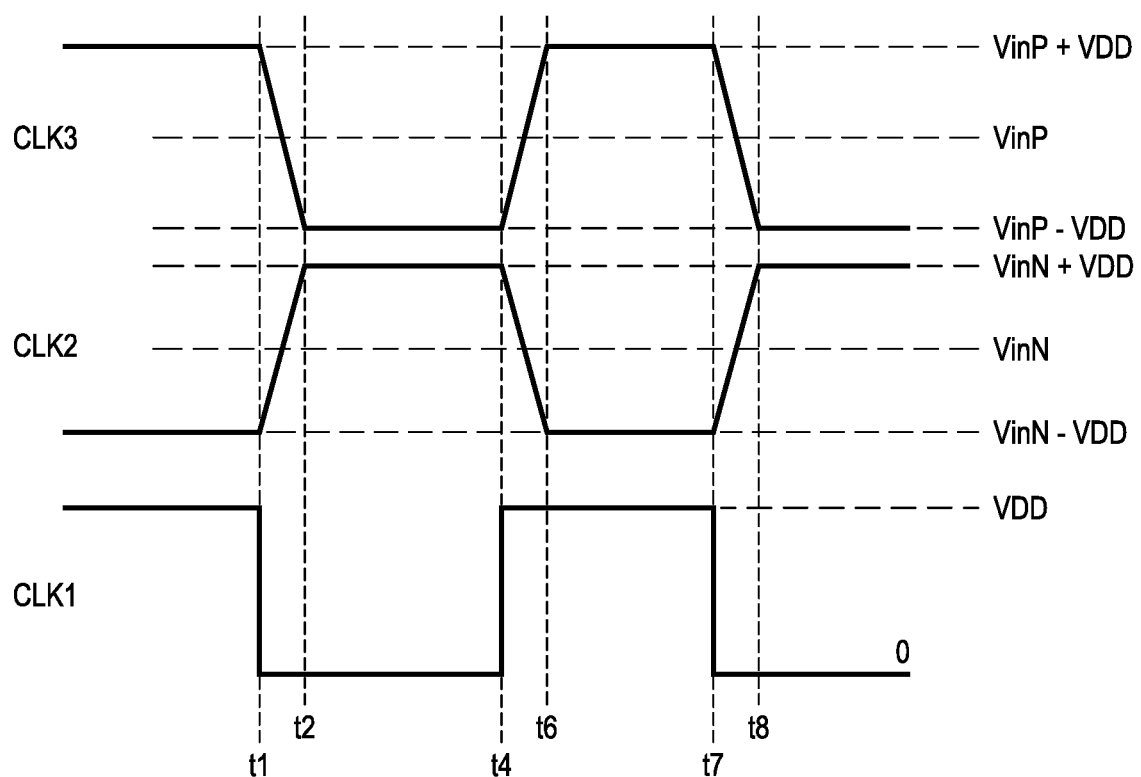
FIG. 1(b) is an illustrative timing diagram depicting clock signals relating to the chopper amplifier circuit of FIG. 1(a), in accordance with various examples.

Referring now to FIG. 1(b), an illustrative timing diagram depicting the clock signals CLK1, CLK2, and CLK3 is shown. The clock signals CLK1, CLK2, and CLK3, in FIG. 1(b), are square waves. However, in other examples, the shape of the clock signals may differ. As noted above, the clock signal CLK1 is generated by the oscillator that is powered by the voltage VDD. The clock signal CLK1, in some examples, oscillates between zero volts and VDD, where zero volts refer to the ground source voltage of oscillator 120. For example, the clock signal CLK1 swings from 0V to VDD at the time instants t1, t7, and from VDD to 0V at the time instants t4, t10. The level shifter 110, based on input clock signal CLK1, generates output clock signals CLK2, CLK3. The clock signal CLK2 oscillates "bipolarly" around the input voltage Vin(N). In some examples, the clock signal CLK2 oscillates between the sum of the input signal Vin(N) and VDD (a first voltage level), and the difference of the input signal Vin(N) and VDD (a second voltage level). For example, the clock signal CLK2 swings from Vin(N)+VDD to Vin(N)—VDD at time instants t2, t8 (with a finite transition time between time instants t1-t2 and t7-t8, respectively). The clock signal CLK2 swings from Vin(N)−VDD to Vin(N)+VDD at the time instants t6, t11 (with a finite transition time between time instants t4-t6 and t10-t11, respectively). This oscillation (or the swing) of the clock signal CLK2 is said to be bipolar relative to the input signal Vin(N) because the clock signal CLK2 swings in both polarities by VDD, relative to the input signal Vin(N). For example, at the time instant t2, the amplitude of the clock signal CLK2 reduces from Vin(N)+VDD to Vin(N)−VDD, or in other words, CLK2 swing negative by twice the VDD in relative to the input voltage Vin(N) at t2. On the other hand, at time t6, the amplitude of the clock signal CLK2 increases from Vin(N)−VDD to Vin(N)+VDD, or in other words, CLK2 swings by twice the VDD in relative to the input voltage Vin(N). In other examples, bipolarly can mean the clock signal CLK2 swinging in both directions till a voltage that is large enough to effectively turn-on/off the transistors.

The clock signal CLK3 also oscillates "bipolarly" around the input voltage Vin(P). In some examples, the clock signal CLK3 oscillates between the sum of the input signal Vin(P), and VDD and the difference of the input signal Vin(P) and VDD. For example, the clock signal CLK3 swings from Vin(P)+VDD to Vin(P)−VDD at time instants t6, t11 (with a finite transition time between time instants t4-t6 and t10-t11, respectively). The clock signal CLK3 swings from Vin(P)−VDD to Vin(P)+VDD at the time instants t2, t8 (with a finite transition time between time instants t1-t2 and t7-t8, respectively). Similarly, in some examples, the oscillation (or the swing) of the clock signal CLK3 can be said to be bipolar with respect to the input signal Vin(P). For example, the at time t2, the amplitude of the clock signal CLK3 increases from Vin(P)−VDD to Vin(P)+VDD, or in other words, CLK3 swings bipolar from VDD below Vin(P) to VDD above Vin(P) in the positive polarity relative to the input voltage Vin(P) at time t2. On the other hand, at time t6, the amplitude of the clock signal CLK3 reduces from Vin(P)+VDD to Vin(N)−VDD, or in other words, CLK3 swings bipolar from VDD above Vin(P) to VDD below Vin(P) in the negative polarity relative to the input voltage Vin(P). In other examples, bipolarly can mean the clock signal CLK3 swinging in both directions till a voltage that is large enough to effectively turn-on/off the transistors.

Figure 2A:
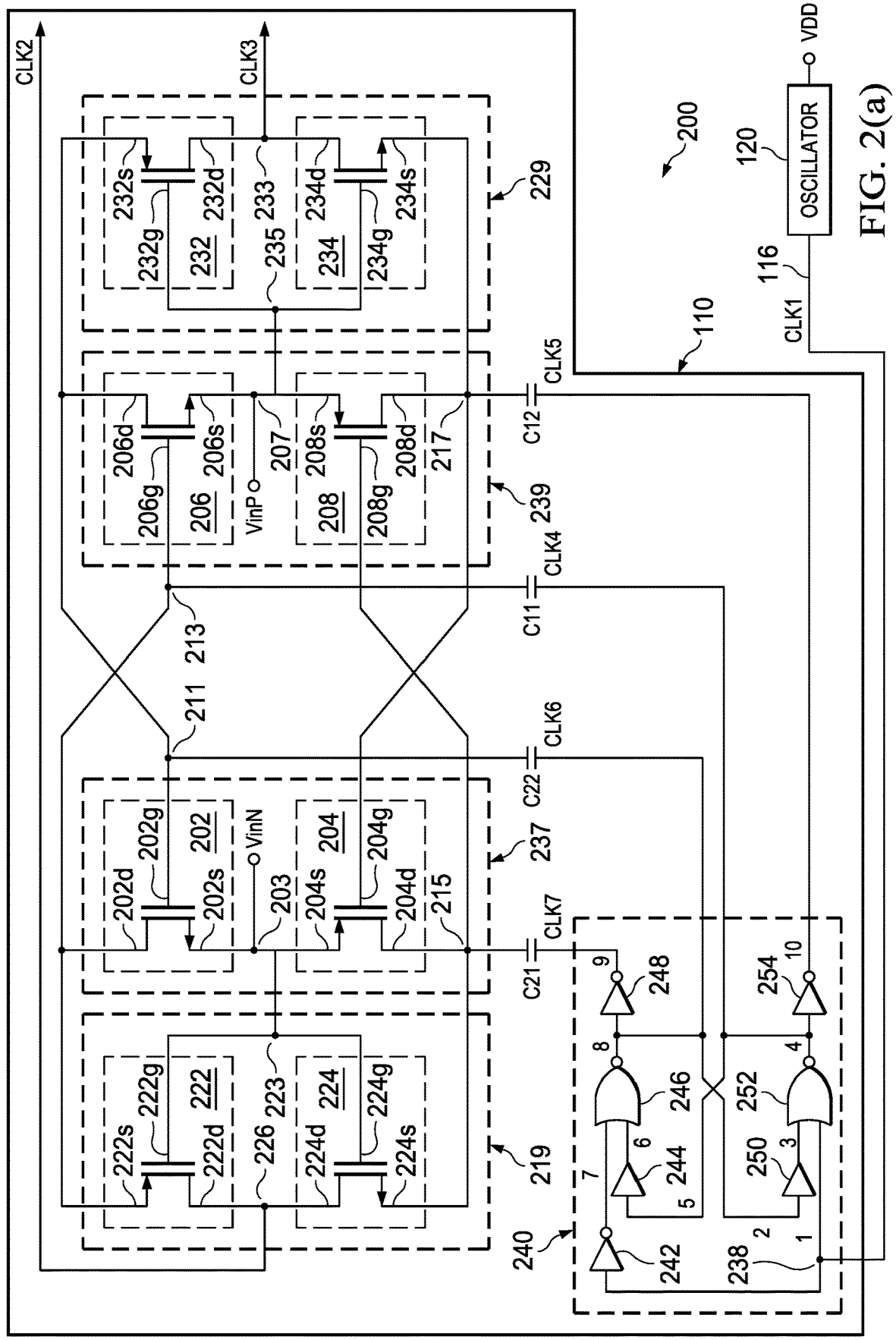
FIG. 2(a) is an illustrative schematic circuit diagram of a level shifter that is configured to generate bipolar clock signals, in accordance with various examples.

Referring now to FIG. 2(a), an illustrative schematic circuit diagram 200 that includes the level shifting circuit 110 that is configured to generate the above-mentioned "bipolar" clock signals, such as clock signals CLK2, CLK3 is shown. The level shifter circuit 110, depicted in FIG. 2(a), includes a non-overlapping clock generation circuit 240 that is disposed in the level shifter circuit 110. In some examples, the clock generation circuit 240 is implemented as a circuit external to the level shifter circuit 110. The clock generation circuit 240, in FIG. 2(a), is coupled to the oscillator 120 via the wire 116. The oscillator 120, as described above, is coupled to a voltage source providing the voltage potential VDD, and generates the clock signal CLK1 (FIG. 1(b)) that swings between VDD and zero volts. Briefly referring to FIG. 2(b), an illustrative timing diagram of clock signals CLK1, CLK2, CLK3, CLK4, CLK5, CLK6, and CLK7 is shown. The clock generation circuit 240 is configured to generate multiple non-overlapping clock signals CLK4, CLK5, CLK6, and CLK7, which facilitate, as further described below, the generation of the bipolar clock signals CLK2, CLK3. For example, the clock signals CLK5, CLK6 are non-overlapping with each other such that the clock signal CLK 6 makes a low-to-high ("LH") transition after the clock signal CLK 5 has made a LH transition. Similarly, the clock signals CLK4, CLK7 are non-overlapping with each other such that the clock signal CLK4 make LH transition after the clock signal CLK7 has made LH transition. In some examples, the clock signals CLK4, CLK5, CLK6, and CLK7 oscillates between the same voltage potentials, 0 and VDD. In other examples, the clock signals CLK4, CLK5, CLK6, and CLK7 oscillates between different sets of voltages.

Still referring to FIG. 2(a), one implementation of the clock generation circuit 240 is depicted. In this example, the clock generation circuit 240 includes buffer logic gates 244, 250; inverters 242, 248, 254; and NOR logic gates 246, 252. The oscillator 120 is coupled to an input terminal 1 of the NOR gate 252. The input terminal 1 also acts as an input terminal to the inverter 242. An output terminal 4 of the NOR gate 252 acts as an input terminal to the inverter 254. An output terminal of the inverter 254 outputs the clock signal CLK5. The buffer 244 is coupled to the output terminal 4 via the terminal 5, which outputs the clock signal CLK4. The output of the inverter 242 couples to the NOR gate 246 via the input terminal 7. The output of the buffer 244 acts as another input (via an input terminal 6) to the NOR gate 246. The output terminal 8 is the output of the NOR gate 246 and couples to the terminal 2 that acts as an input to the buffer 250 and also output the clock signal CLK 6. The output terminal 8 couples to the inverter 248 and acts as its input. The output terminal 9 couples to the output of the inverter 248, which generates the clock signal CLK7. In some examples, the output terminal 9 couples to a capacitor C21, which further couples to the node 215 and receive the clock signal CLK7. The output terminal 10 couples to a capacitor C12, which further couples to the node 217 and receives the clock signal CLK5. The terminal 5 couples to a capacitor C11, which further couples to the node 213 and receives the clock signal CLK4, and the terminal 2 couples to a capacitor C22, which further couples to the node 211 and receives and clock signal CLK5.

Still referring to FIG. 2(a), the level shifter circuit 110 includes a first transistor pair 237 formed by the transistors 202, 204 that are cascoded at an input node 203. In some examples, the transistors 202, 204 are MOSFETs. In such examples, the transistor 202 includes a source terminal 202s, a drain terminal 202d, and a gate terminal 202g. The transistor 204 includes a source terminal 204s, a drain terminal 204d, and a gate terminal 204g. In this disclosure, the transistor 202 is assumed to be an n-doped MOSFET (nMOS), and the transistor 204 is a p-doped MOSFET (pMOS). The source terminal 202s couples to the source terminal 204s at a node 203, which is configured to receive the input signal Vin(N). The level shifter circuit 110 includes a second transistor pair 239 formed by the transistors 206, 208 that are cascoded at an input node 207. In some examples, the transistors 206, 208 are also MOSFETs. In such examples, the transistor 206 includes a source terminal 206s, a drain terminal 206d, and a gate terminal 206g. The transistor 208 includes a source terminal 208s, a drain terminal 208d, and a gate terminal 208g. In this disclosure, the transistor 206 is an n-doped MOSFET (nMOS), and the transistor 208 is a p-doped MOSFET (pMOS). The source terminal 206s couples to the source terminal 208s at a node 207, which is configured to receive the input signal Vin(P).

The first transistor pair 237 and the second transistor pair 239 are coupled at nodes 211, 213, 215, and 217. Stated another way, the drain terminal 202d couples to the gate terminal 206g at the node 213; the drain terminal 206d couples to the gate terminal 202g at the node 211; the drain terminal 204d couples to the gate terminal 208g at the node 215; the drain terminal 208d couples to the gate terminal 204g at the node 217. The level shifter 110 further includes a third transistor pair (or transistor circuit) 219 that is coupled to the first transistor pair 237 at the node 213, 215, and is configured to receive a signal VinN via a node 223. The third transistor pair 219 is configured to generate a bipolar clock signal, such as the clock signal CLK 2. The level shifter 110 further includes a fourth transistor pair (or transistor circuit) 229 that is coupled to the second transistor pair 239 at the node 211, 217, and is configured to receive a signal VinP via a node 235. The fourth transistor pair 229 is configured to generate a bipolar clock signal, such as the clock signal CLK 3.

In some examples, the third transistor pair 219 includes a transistor 222 comprising a source terminal 222s, a drain terminal 222d, and a gate terminal 222g, where the source terminal 222s couples to the drain terminal 202d at a node 213. The inverter circuit also includes a transistor 224 comprising a source terminal 224s, a drain terminal 224d, and a gate terminal 224g, where the source terminal 224s couples to the drain terminal 204d at the node 215, and the gate terminal 224g couples to the gate terminal 222g and to the input node 203 at a node 223, where the drain terminal 222d couples to the drain terminal 224d at a node 226 to generate the first output, which is the bipolar clock signal CLK2.

In some examples, the fourth transistor pair 229 includes a transistor 232 comprising a source terminal 232s, a drain terminal 232d, and a gate terminal 232g, where the source terminal 232s couples to the drain terminal 206d at a node 211. The inverter circuit also includes a transistor 234 comprising a source terminal 234s, a drain terminal 234d, and a gate terminal 234g, where the source terminal 234s couples to the drain terminal 208d at the node 217, and the gate terminal 234g couples to the gate terminal 232g and to the input node 207 at a node 235, where the drain terminal 232d couples to the drain terminal 234d at a node 233 to generate the second output, which is the bipolar clock signal CLK3. The transistor pairs 219, 229 described above can be implemented using any other suitable circuitry.

Figure 2B:
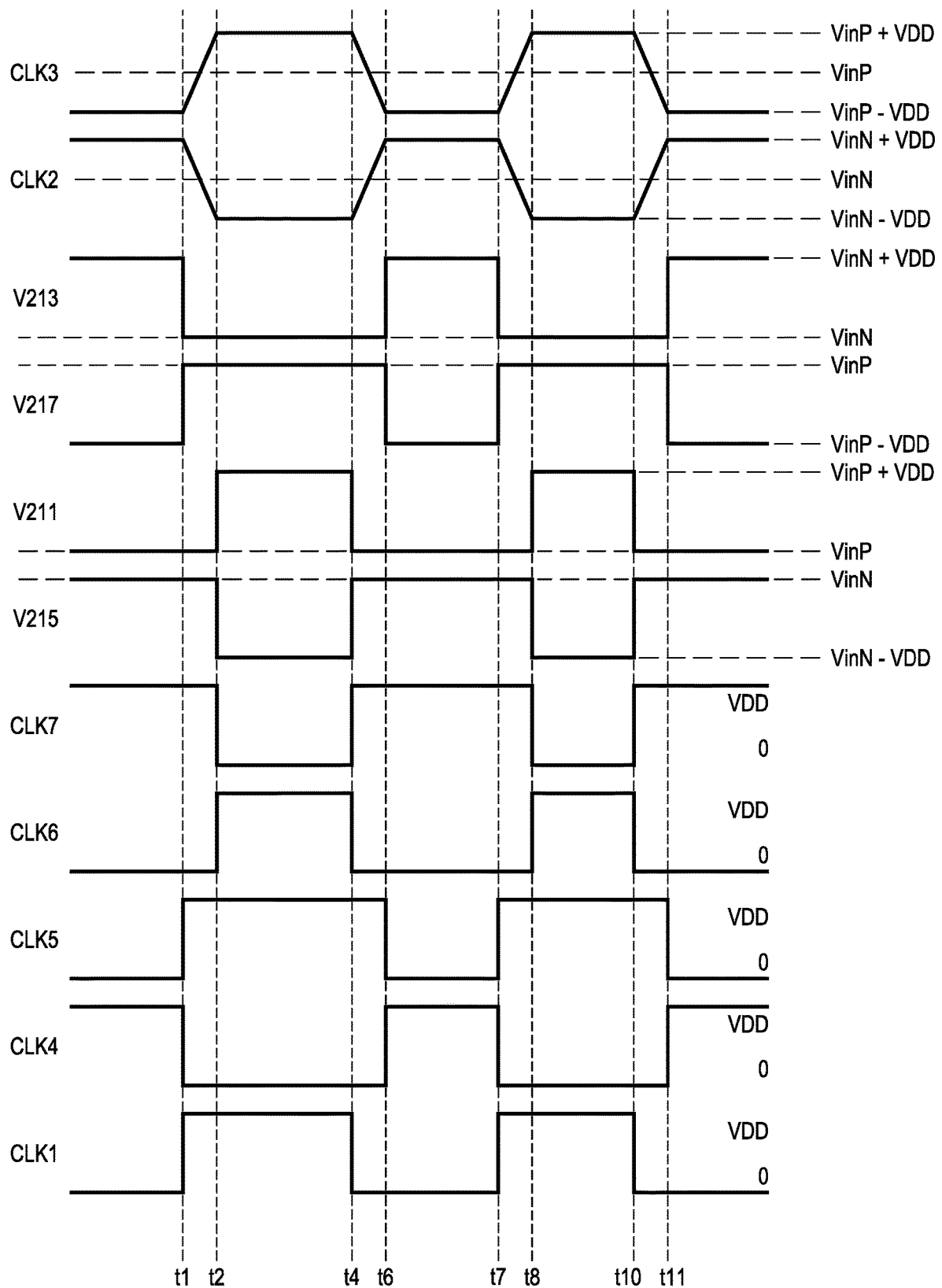
FIG. 2(b) is another illustrative timing diagram depicting clock signals relating to the level shifter of FIG. 2(a), in accordance with various examples.

As noted above, the clock generation circuit 240 is configured to generate multiple non-overlapping clock signals CLK4, CLK5, CLK6, and CLK7. The clock signals CLK4, CLK5, CLK6, and CLK7 oscillate between zero volts and VDD. As described below, the non-overlapping nature of the clocks signals CLK4, CLK5, CLK6, and CLK7 prevents short circuit condition in the chopper circuit 130 in FIG. 1(a). The generation of the clock signals CLK1, CLK2, CLK3, CLK4, CLK5, CLK6, and CLK7 is now described in tandem with FIG. 2(a) and FIG. 2(b). First, the generation of the clock signals CLK4, CLK5, CLK6, and CLK7 is described, primarily because the clock signals CLK4, CLK5, CLK6, and CLK7 facilitate the generation of the clock signals CLK2 and CLK3. Therefore, understanding the generation of the clock signals CLK4, CLK5, CLK6, and CLK7 is crucial. As the clock signal CLK1 swings from zero volts to VDD at the time instant t1, the NOR gate 252 outputs zero at the output terminal 4 because a NOR logic gate outputs zero if either of the inputs to a NOR logic gate is high (e.g., VDD). The output terminal 4 also acts as the input terminal to the inverter 254, which inverts the input and generates a logic high (e.g., VDD) signal at the output terminal 10. The output terminal 10, as described above, outputs clock signal CLK5, which is depicted in FIG. 2(b). The output of the NOR gate 252 (at the output terminal 4) forms the clock signal CLK4, which is the inverse of the clock signal CLK5. The output of the NOR gate 252 is fed to the buffer 244, which introduces a slight delay (e.g., few nanoseconds) to the clock signal CLK4. Since the buffer 244 is a unity gain buffer, the clock signal CLK4, along with a finite delay, is inputted to the NOR gate 246 via the input terminal 6. The NOR gate 246 also receives an inverted clock signal CLK1 via the inverter 242 by the input terminal 7. At time instant t1, the NOR gate 246 receives a logic low (e.g., 0 V) signal via the input terminal 7. The NOR gate 246 receives a delayed version of the clock signal CLK4 (which is also logic low (e.g., 0V)) at the time instant t2 making the output of the NOR gate 246 logic high. The output of the NOR gate 246 is the clock signal CLK6, which is delayed with respect to the clock signal CLK4. The output of the NOR gate 246 is fed to the inverter 248, which produces the clock signal CLK7 at the output terminal 9. The clock signal CLK7 is an inverted version of the clock signal CLK6.

Before understanding the generation of the clock signals CLK2, CLK3, the voltage potential at the nodes 211, 213, 215, and 217 at different time instants is described. Graphs V211, V213, V215, and V217 depict the voltage potential at the nodes 211, 213, 215, and 217, respectively. Now refer briefly to CLK4, which swings from VDD to 0V at time instants t1 and t7. At time instants t1, t7, because of the capacitor C11, the potential at the node 213 reduces by VDD (see V213 at time instants t1, t7). On the other hand, when the clock signal CLK4 transitions from 0 to VDD (see time instants t6, t11), the potential at the node 213 increases by VDD (see V213 at time instants t6, t11). In the graph V213, it is assumed that the node 213 was previously at VinN potential, the reason of which will be apparent ahead.

Now refer to the clock signal CLK6, at the time instants t2, t8, the clock signal CLK6 transitions from 0 to VDD and the voltage potential of the node 211 (see V211 at time instant t2) transitions from VinP to VinP+VDD. On the other hand, when the clock signal CLK6 transitions from VDD to 0 (see time instants t4, t10), the potential at the node 211 decreases by VDD (see V211 at time instants t4, t10). It is assumed that the node 211 was previously at VinP potential, the reason of which will be apparent ahead. Similarly for clock signal CLK5, the voltage at the node 217 follows the clock signal CLK5. For example, when the clock signal CLK5 transitions from 0 to VDD at time instants t1, t7, the voltage at the node 217 increases by VDD (see graph V217 at time instants t1, t7). On the other hand, when the clock signal CLK5 transitions from VDD to 0 (see time instants t6, t11), the potential at the node 211 decreases by VDD (see V217 at time instants t6, t11). Similarly, the voltage at the node 215 follows the clock signal CLK7 at time instants t2, t4, t8, and t10.

The alternate turning on/off of the transistors 202 and 206 is now described. It is assumed that the signal Vin(N) is substantially equal to the signal Vin(P) (e.g., within +/−100 mV of each other). The increase of potential at the node 211 (see V211 at time instants t2, t8) increases the potential at the gate terminal 202g above Vin(N), and turns on the transistor 202—which is an nMOS. With the potential at the node 211 at VinP+VDD and source voltage of VinN at the source terminal 202S, the transistor 202 turns on and forces the drain terminal 202d to equal VinN. The drain terminal 202d couples the node 213, thereby forcing the potential of the node 213 to equal VinN (see V213 at time instants t1, t7). At the time instant t4, the clock signal CLK6 transitions from VDD to 0 and forces the voltage at the node 211 to swing low by VDD (for example, see V211 at the time instant t4). Therefore, at time instant t4, the transistor 202 turns off. With the transistor 202 turned off, when the clock signal CLK4 transitions from 0 to VDD at the time instant t6, the voltage of the node 213 transitions from VinN to VinN+VDD (see V213 at the time instant t6). The node 213 couples to the gate 206g and the source 206s receives the signal VinP, and therefore, at the time instant t6, the transistor 206 turns on and forces the potential of node 211 to equal VinP. This process repeats itself at other instances where the clock signals CLK4, 6, swings between 0 and VDD.

The alternate turning on/off of the transistors 204 and 208 is now described. It is again assumed that the signal Vin(N) is substantially equal to the signal Vin(P) (e.g., within +/−100 mV of each other). The decrease of potential at the node 215 (see V215 at time instants t2, t8) decreases the potential at the gate terminal 208g below Vin(P), and turns on the transistor 208—which is a pMOS. With the potential at the node 215 at VinN-VDD and source voltage of VinP at the source terminal 208S, the transistor 208 turns on and forces the drain terminal 208d to equal VinP. The drain terminal 208d couples the node 217, thereby forcing the potential of the node 217 to equal VinP (see V217 at time instants t2, t8). At the time instant t4, the clock signal CLK7 transitions from 0 to VDD and forces the voltage at the node 215 to swing high by VDD (for example, see V215 at the time instant t4). Therefore, at time instant t4, the transistor 208 turns off (because the gate terminal 208g is at VinN potential and the source terminal 208s is at VinP potential). With the transistor 208 turned off, when the clock signal CLK5 transitions from VDD to 0 at the time instants t6, t11, the voltage of the node 217 transitions from VinP to VinP-VDD (see V217 at the time instants t6, t11). The node 217 couples to the gate 204g and the source 204s receives the signal VinN, and therefore, at the time instants t6, t11, the transistor 204 turns on and forces node 215 voltage equal to VinN. This process repeats itself at other instances where the clock signals CLK5, 7, swings between 0 and VDD and vice versa. From the alternate turning on/off of the transistors 202, 206 and 204, 208, it is implicit that the transistors 202, 204 of the first transistor pair 237 alternatively turns on/off and the transistors 206, 208 of the second transistor pair 239 alternatively turns on/off.

The generation of the clock signals CLK2, CLK3 is now described in conjunction with the signals VinN, VinP, and the voltage swings that occur at the nodes 211, 213, 215, and 217. Between the time instants t2 to t4, the potential at the node 213 is at VinN and the potential at the node 215 is at VinN-VDD. During t2-t4, the transistor 222 is turned off—as it is a pMOS and the CLK2 between t2-t4 follows the potential at the node 215—see CLK 2 between time instances t2-t4. On the other hand, between time instances t2-t4, the potential at the node 211 is at VinP+VDD and the potential at the node 217 is at VinP. During t2-t4, the transistor 234 is turned off—as it is an nMOS and the CLK3 between t2-t4 follows the potential at the node 211—see CLK3 between time instances t2-t4. Similarly between time instances t6-t7, the potential at the node 213 is at VinN+VDD and the potential at the node 215 is at VinN. This condition turns off the transistor 224 and turns on transistor 222 where the CLK2 signal follows the potential at the node 213. Similarly, between time instances t6-t7, the potential at the node 211 is at VinP and the potential at the node 217 is at VinP-VDD. This condition turns off the transistor 232 and turns on transistor 234 where the CLK3 signal follows the potential at the node 217.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value. The terms voltage and voltage level are interchangeably used.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system, comprising:
an oscillator having an output wherein the output generates a first clock signal; and
a level shifter circuit comprising:
a first input terminal coupled to receive a first input signal;
a second input terminal coupled to receive a second input signal
a third input terminal coupled to the output of the oscillator;
a first output terminal configured to generate a second clock signal that oscillates with a magnitude centered on the first input signal; and
a second output terminal configured to generate a third clock signal that oscillates with a magnitude centered on the second input signal.

2. The system of claim 1, wherein the first clock is configured to oscillate between a first voltage level and a second voltage level, the second clock is configured to oscillate between a third voltage level and a fourth voltage level, and the third clock is configured to oscillate between a fifth voltage level and a sixth voltage level.

3. The system of claim 2, wherein the first voltage level is zero volts, the third voltage level is a first sum of the first input signal and the second voltage level, the fourth voltage level is a first difference of the first input signal and the second voltage level, the fifth voltage level is a second sum of the second input signal and the second voltage level, and the sixth voltage level is a second difference of the second input signal and the second voltage level.

4. The system of claim 1, wherein the second clock signal swings bipolarly relative to the first input signal, and the third clock signal swings bipolarly relative to the second input signal.

5. The system of claim 1, wherein the first and second input signals are substantially equal.

* * * * *